United States Patent [19]

Miyamoto

[11] Patent Number: 4,985,869
[45] Date of Patent: Jan. 15, 1991

[54] SEMICONDUCTOR MEMORY DEVICE WITH AN IMPROVED SUBSTRATE BACK-BIAS ARRANGEMENT

[75] Inventor: Eiji Miyamoto, Ohme, Japan

[73] Assignee: Hitachi, Ltd., Tokyo, Japan

[21] Appl. No.: 375,492

[22] Filed: Jul. 5, 1989

[30] Foreign Application Priority Data

Jul. 5, 1988 [JP] Japan .................................. 63-167575
Jul. 5, 1988 [JP] Japan .................................. 63-167576

[51] Int. Cl.⁵ .............................................. G11C 7/00
[52] U.S. Cl. ..................................... 365/226; 365/222
[58] Field of Search ................... 365/189.09, 226, 222, 365/189.11

[56] References Cited

U.S. PATENT DOCUMENTS 4,775,959 10/1988 Sato et al. ...................... 365/189.09

Primary Examiner—Joseph A. Popek
Attorney, Agent, or Firm—Antonelli, Terry, Stout & Kraus

[57] ABSTRACT

A substrate back bias voltage generator of a dynamic type RAM is provided with a first voltage generator having a relatively large current supply capacity, a second voltage generator having a relatively small current supply capacity, and a substrate back bias voltage detecting circuit for controlling operation of the first voltage generator. For example, when the dynamic type RAM is in a $\overline{\text{CAS}}$ before $\overline{\text{RAS}}$ refresh mode, the operation of the first voltage generator is limited selectively, and the operation of the second voltage generator and the substrate back bias voltage detecting circuit is stopped selectively.

7 Claims, 6 Drawing Sheets

SEMICONDUCTOR MEMORY DEVICE WITH AN IMPROVED SUBSTRATE BACK-BIAS ARRANGEMENT

BACKGROUND OF THE INVENTION

The present invention relates to a semiconductor memory device, and more particularly to effective technology to be utilized, for example, in a dynamic type RAM (random access memory) incorporating a substrate back bias voltage generator.

In a dynamic type RAM having a MOSFETs (metal oxide semiconductor field effect transistor) as the basic elements, a method is known that a suitable substrate back bias voltage is supplied to a semiconductor substrate so that parasitic capacity between the semiconductor substrate and each circuit element is controlled to stabilize the operation. Also a dynamic type RAM incorporating a substrate back bias voltage generator to form the substrate back bias voltage has been developed.

Regarding various dynamic type RAMs having such substrate back bias voltage generators, U.S. Pat. Nos. 4,775,959, 4,631,421 and 4,455,628 have been disclosed. Also control of operation of the substrate back bias voltage generator based on an output of a level detecting circuit to monitor the substrate voltage is described in the U.S. Pat. Nos. 4,775,959 and 4,631,421.

SUMMARY OF THE INVENTION

FIG. 5 shows a circuit diagram of a substrate back bias generator which was devised and studied by the present inventor prior to the present invention In FIG. 5, the substrate back bias voltage generator $V_{BB}GO$ includes two voltage generators $VG_1$ and $VG_2$ having different current supply capacities. Among these, the voltage generator $VG_1$ is designed to have relatively large current supply capacity which can maintain voltage level or restore it temporarily when the dynamic type RAM is placed in the selective state or when the absolute value of the substrate back bias voltage $V_{BB}$ becomes the prescribed value or less. This generator is placed into an operation state selectively in accordance with an output signal n4 of the level detecting circuit LVM to monitor the substrate back bias voltage $V_{BB}$ or timing signal $\phi$rl formed in the selective state of the dynamic type RAM. On the other hand, the voltage generator $VG_2$ is designed to have relatively small current supply capacity which can compensate for the leakage current to the substrate and supply the operation current of the level detecting circuit LVM. $VG_2$ is kept in its operation state steadily irrespective of the selective state of the dynamic RAM. Since the voltage generator $VG_1$ requiring the relatively large operation current is placed in the operation state selectively as above described, the average operation current of the substrate back bias generator is reduced and the dynamic type RAM is operated at relatively low consumption power.

The present inventor has further developed a dynamic type RAM of super low consumption power for battery backup, and proposed to provide the dynamic type RAM of super low consumption power with a substrate back bias voltage generator as shown in FIG. 5. In the above-mentioned substrate back bias voltage generator, however, when the dynamic RAM is rendered into the selective state, the relatively large voltage generator $VG_1$ is rendered into the operation state unconditionally irrespective of the operation mode. Consequently, during refresh mode or the like where level variation of the substrate back bias voltage is relatively little, the operation current of the substrate back bias voltage generator undesirably becomes large. As a result, the average consumption power of the dynamic RAM is increased, and it becomes clear from the studies of the present inventor that a problem of deviating from the specification as the dynamic type RAM of low consumption power occurs.

Further when the level detecting circuit LVM is rendered into the operation state steadily as above described, although the leakage current itself to the substrate is quite a small value, in order to supply the operation current of the level detecting circuit LVM, the voltage generator $VG_2$ must be rendered into the operation state steadily. When the level deterioration of the substrate back bias voltage $V_{BB}$ is detected, the voltage generator $VG_1$ must be rendered into the operation state selectively. This increases the operation current of the substrate back bias voltage generator in the standby state, and it becomes clear from the studies of the present inventor that a cause to limit the dynamic type RAM of super low consumption power in the operation at low consumption power is produced.

A first object of the invention is to provide a semiconductor memory device such as a dynamic type RAM wherein operation of the incorporated substrate back bias voltage generator can be controlled in response to the operation mode when the dynamic type RAM is at the selective state.

A second object of the invention is to provide a semiconductor memory device such as a dynamic type RAM wherein operation of a substrate bias voltage level detecting circuit to limit the incorporated substrate back bias voltage generator from further operation of the substrate back bias voltage generator can be selectively stopped.

Still another object of the invention is to realize a dynamic type RAM of super low consumption power which can reduce the average operation current of the incorporated substrate back bias voltage generator and be used for battery backup or the like.

The foregoing and other objects and novel features of the invention will appear more fully from the description of the specification and the accompanying drawings.

Typical constitution to attain the first embodiment will be described as follows. A substrate back bias voltage generator of a dynamic type RAM is provided with a first voltage generator having relatively large current supply capacity and a second voltage generator having relatively small current supply capacity. When the dynamic type RAM is rendered into the selective state in the ordinary operation mode or when the dynamic type RAM is rendered into the non-selective state and the absolute value of the substrate back bias voltage becomes the prescribed value or less, the first voltage generator is rendered into the operation state selectively, and, for example, when the dynamic type RAM is rendered the $\overline{CAS}$ before $\overline{RAS}$ refresh mode, the operation number of the first voltage generator is limited selectively and the operation of the second voltage generator is stopped selectively.

According to the above-mentioned means, in the $\overline{CAS}$ before $\overline{RAS}$ refresh mode where the level variation of the substrate back bias voltage is relatively little, the operation current of the substrate back bias voltage generator can be reduced. Consequently, when the dynamic type RAM or the like is refreshed by the $\overline{CAS}$ before $\overline{RAS}$ refresh mode, the average consumption power of the dynamic type RAM or the like can be significantly reduced. Thereby the dynamic type RAM of super low consumption power to be used for battery backup can be realized. Such period is specified as the user specification that the substrate back bias voltage generator is rendered into the operation state in accordance with the combination of the starting control signals and the operation is stopped.

According to the above-mentioned means, in range where the dynamic type RAM is not obstructed, the operation of the incorporated back bias voltage generator and the level detecting circuit can be stopped with the intention. Consequently, since the average operation current of the substrate back bias voltage generator in the standby state can be reduced, the dynamic type RAM of super low consumption power to be used for battery backup can be realized.

DESCRIPTION OF THE PREFERRED EMBODIMENTS

Figure 2:
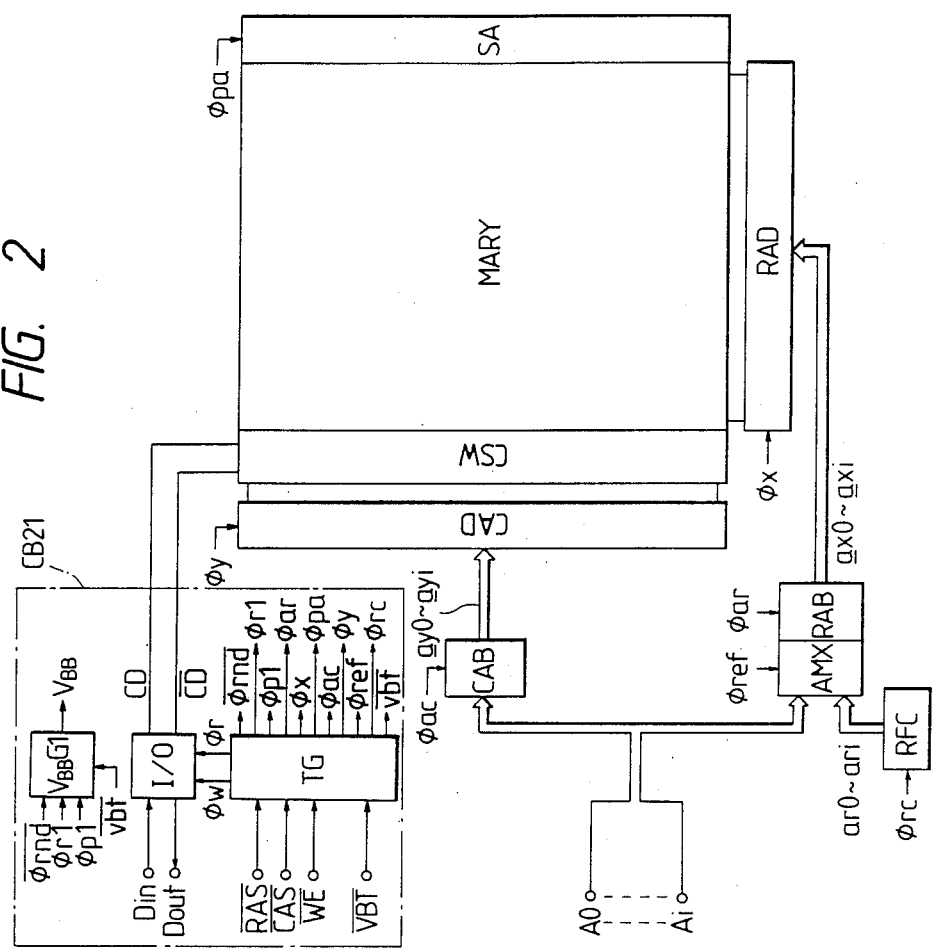
FIG. 2 is a block diagram illustrating an embodiment of a dynamic type RAM including the substrate back bias voltage generator in FIG. 1.

FIG. 2 is a block diagram of a dynamic type RAM as a first embodiment of the invention. In FIG. 2, circuit elements constituting each circuit block are formed by known manufacturing method of a semiconductor integrated circuit on one semiconductor substrate such as monocrystalline silicon although not particularly limited thereto.

The dynamic type RAM of the embodiment incorporates a substrate back bias voltage generator $V_{BB}G1$ which receives the power source voltage of the circuit and forms the prescribed substrate back bias voltage $V_{BB}$. In the embodiment, the substrate back bias voltage generator $V_{BB}G1$, as hereinafter described, comprises a voltage generator $VG_1$ having relatively large current supply capacity and a voltage generator $VG_2$ having relatively small current supply capacity. Among these, the voltage generator $VG_1$ is selectively rendered the operation state continuously in accordance with a corresponding pulse signal, when the dynamic type RAM is rendered the selective state in ordinary operation mode or when the dynamic type RAM is rendered the no-selective state and the absolute value of the substrate back bias voltage $V_{BB}$ becomes the prescribed value or less, although not particularly limited thereto. Also when the dynamic type RAM is rendered the selective state in $\overline{CAS}$ before $\overline{RAS}$ refresh mode, the voltage generator $VG_1$ is rendered the operation state only one time in accordance with a pulse signal formed in single shot. On the other hand, the voltage generator $VG2$ is rendered the operation state continuously in accordance with a corresponding pulse signal when the dynamic type RAM is rendered the non-selective state or the selective state in ordinary operation mode. Also when the dynamic type RAM is rendered the selective state in $\overline{CAS}$ before $\overline{RAS}$ refresh mode, the operation is selectively stopped. Consequently, in the dynamic type RAM of the embodiment, the operation current of the substrate back bias voltage generator is reduced in the $\overline{CAS}$ before $\overline{RAS}$ refresh mode where the level variation of the substrate back bias voltage $V_{BB}$ is relatively little, and the refresh is performed by the $\overline{CAS}$ before $\overline{RAS}$ refresh mode thereby the average consumption power is significantly reduced.

In FIG. 2, a memory array MARY includes plural word lines arranged in parallel to the vertical direction in the figure, plural complementary lines arranged in parallel to the horizontal direction in the figure, and plural dynamic type memory cells arranged on intersections between the word lines and the complementary data lines.

The word lines constituting the memory array MARY are connected to a row address decoder RAD and rendered the selective state alternatively.

The row address decoder RAD, although not particularly limited thereto, is supplied with complementary inner address signals ax0–axi of (i+1) bits from a row address buffer RAB (Wherein, for example, non-inverted inner address signal ax0 and inverted inner address signal $\overline{ax0}$ together are represented as complementary inner address signal ax0. The same shall apply hereinafter.), and is supplied with a timing signal $\phi x$ from a timing generator TG.

The timing signal $\phi x$ is made high level, thereby the row address decoder RAD is rendered the operation state selectively. In the operation state, the row address decoder RAD decodes the complementary inner address signals ax0–axi, and the corresponding word lines of the memory array MARY are rendered the selective state of high level alternatively.

The row address buffer RAB takes and holds row address signals transmitted from the address multiplexer AMX in accordance with a timing signal $\phi ar$ supplied from a timing generator TG. The complementary inner address signals ax0–axi are formed based on these row address signals and supplied to the row address decoder RAD.

The address multiplexer AMX, although not particularly limited thereto, selects the X address signals AX0–AXi supplied in time division through outer terminals A0–Ai when the dynamic type RAM is rendered the ordinary operation mode and a timing signal $\phi ref$ of low level is supplied from the timing generator TG, and transmits the signals as row address signals to the row address buffer RAB. Also when the dynamic type RAM is rendered the refresh mode and the timing signal $\phi ref$ is made high level, the refresh address signals ar0–ari supplied from the refresh address counter RFC are selected, and transmitted as the row address signals to the row address buffer RADB.

The refresh address counter RFC, although not particularly limited thereto, performs the start-stop operation in accordance with the timing signal $\phi rc$ supplied from the timing generator TG when the dynamic type RAM is rendered the refresh mode. As a result, the refresh address signals ar0-ari are formed and supplied to the address multiplexer AMX.

On the other hand, the complementary data lines constituting the memory array MARY are connected to corresponding unit amplifier circuits of a sense amplifier SA on one side, and connected to corresponding switches MOSFET of a column switch CSW on other side.

The sense amplifier SA includes a plurality of unit amplifier circuits installed corresponding to each complementary data line of the memory array MARY. These unit amplifier circuits are supplied with the timing signal $\phi pa$ from the timing generator TG.

The timing signal $\phi pa$ is made high level, thereby each unit amplifier circuit of the sense amplifier SA is rendered the operation state selectively. In the operation state, each unit amplifier circuit amplifies the very small read signal outputted from plural memory cells connected to the selected word lines of the memory array MARY through the corresponding complementary data lines, and makes it a binary read signal of high level or low level.

The column switch CSW includes plural pairs of switches MOSFET installed corresponding to each complementary data line of the memory array MARY. These switches MOSFET are connected on one side to the corresponding complementary data lines of the memory array respectively as above described, and connected on other side commonly to a non-inverted signal line CD and an inverted signal line $\overline{CD}$ of the complementary data lines alternately. Gates of each pair of switches MOSFET are commonly connected respectively, and supplied with corresponding data line selective signals from the column address signals respectively.

The corresponding data line selective signals are made high level alternatively, thereby each pair of the switches MOSFET of the column switch CSW are turned on selectively. AS a result, the corresponding complementary data lines of the memory array MARY are connected to the complementary common data lines CD, $\overline{CD}$ selectively.

The column address decoder CAD, although not particularly limited thereto, is supplied with complementary inner address signals ay0-ayi of (i+1) bits from a column address buffer CAB, and with a timing signal $\phi y$ from the timing generator TG.

The timing signal $\phi Y$ is made high level, thereby the column address decoder CAD is rendered the operation state selectively. In the operation state, the column address decoder CAD decodes the complementary inner address signals ay0-ayi, and the corresponding data line selective signals are made high level alternatively. These data line selective signals, as above described, are supplied to the corresponding switches MOSFET of the column switch CSW respectively.

The column address buffer CAB takes and holds the Y address signals AY0-AYi supplied in time division through the outer terminals A0-Ai in accordance with a timing signal $\phi ac$ supplied from the timing generator TG. The complementary inner address signals ay0-ayi are formed based on these Y address signals, and supplied to the column address decoder CAD.

The complementary common data lines CD, $\overline{CD}$ are connected to a data input/output circuit I/O, although not particularly limited thereto.

The data input/output circuit I/O includes a data inlut buffer and a data output buffer, although not particularly limited thereto. Among these, the input terminal of the data input buffer is connected to a data input terminal $D_{in}$, and the output terminal thereof is connected to complementary common data lines CD, $\overline{CD}$. The data input buffer is supplied with a timing signal $\phi w$ from the timing generator TG. On the other hand, the input terminal of the data output buffer is commonly connected to the complementary common data lines CD, $\overline{CD}$, and the output terminal thereof is connected to a data output terminal $D_{out}$. The data output buffer is supplied with a timing signal $\phi r$ from the timing generator TG.

The dynamic type RAM is rendered the write mode and the timing signal $\phi w$ is made high level, thereby the data input buffer of the data input/output circuit I/O is rendered the operation state selectively. In the operation state, the data input buffer forms a complementary write signal in accordance with the write data supplied through the data input terminal Din, and supplies the complementary write signal to the selected memory cell of the memory array MARY through the complementary common data lines CD, $\overline{CD}$. Although not particularly limited thereto, when the timing signal $\phi w$ is made low level, output of the data input buffer is made high impedance state.

The dynamic type RAM is rendered the read mode and the timing signal $\phi r$ is made high level, thereby the data output buffer of the data input/output circuit I/O is rendered the operation state selectively. In the operation state, the data output buffer further amplifies a binary read signal outputted through the selected complementary data lines of the memory array MARY, and outputs it through the data output terminal $D_{out}$. Although not particularly limited thereto, when the timing signal $\phi r$ is made low level, output of the data output buffer is made high impedance state.

The dynamic type RAM of the embodiment incorporates the substrate back bias voltage generator $V_{BB}G$ as above described. The substrate back bias voltage generator $V_{BB}G$, although not particularly limited thereto, is supplied with an inverted timing signal $\overline{\phi rnd}$ and timing signals $\phi rl$ and $\phi pl$ from the timing generator TG as well as inverted inner control signal $\overline{vbt}$. In this case, the inverted timing signal $\overline{\phi rnd}$, although not particularly limited thereto, is made high level when the dynamic type RAM is rendered the non-selective state, and is made low level selectively when the dynamic type RAM is rendered the selective state in ordinary operation mode. That is, the inverted timing signal $\overline{\phi rnd}$ remains high level, when the dynamic type RAM is rendered the selective state in $\overline{CAS}$ before $\overline{RAS}$ refresh mode. When the dynamic type RAM is rendered the selective state, the timing signal $\phi rl$ is made high level in accordance with the row address strobe signal $\overline{RAS}$ irrespective of the operation mode. Also when the timing signal $\phi rl$ is made high level or low level, the timing signal $\phi pl$ is made high level or low level in slightly delaying from the timing signal $\phi rl$. Further the inverted inner control signal $\overline{vbt}$, although not particularly limited thereto, is normally made high level, and is made low level selectively when an examination control signal $\overline{VBT}$ is made low level and the dynamic type RAM is rendered the substrate buffer bias voltage examination mode.

The substrate back bias voltage generator $V_{BB}G1$, as hereinafter described, forms the substrate back bias voltage $V_{BB}$ being prescribed negative voltage based on the power source voltage of the circuit, and supplies it to the semiconductor substrate of the dynamic type RAM. Thereby parasitic capacity between the semicondcutor substrate and each circuit element is controlled and the operation of the dynamic type RAM is stabilized.

In the embodiment, the substrate back bias voltage generator $V_{BB}G1$, as hereinafter described, comprises a voltage generator VG1 having relatively large current supply capacity, and a voltage generator VG2 having relatively small current supply capacity. These voltage generators are rendered the operation state selectively in the prescribed combination in accordance with the inverted timing signal $\phi$rnd and the timing signals $\phi$rl and $\phi$r2. Also when the inverted inner control signal $\overline{vbt}$ is made low level, the operation of the voltage generators VG1 and VG2 is stopped. Thereby the operation characteristics of the dynamic RAM can be confirmed in the state that the substrate back bias voltage $V_{BB}$ is not supplied.

The specific circuit constitution of the substrate back bias voltage generator $V_{BB}G1$ and its operation will be hereinafter described in detail.

The timing generator TG forms the various sorts of timing signals and the inner control signals based on the row address strobe signal $\overline{RAS}$, the column address strobe signal $\overline{CAS}$, the write enable signal $\overline{WE}$ and the examination control signal $\overline{VBT}$ supplied as control signals from the outside, and supplies them to each circuit of the dynamic type RAM.

Figure 1:
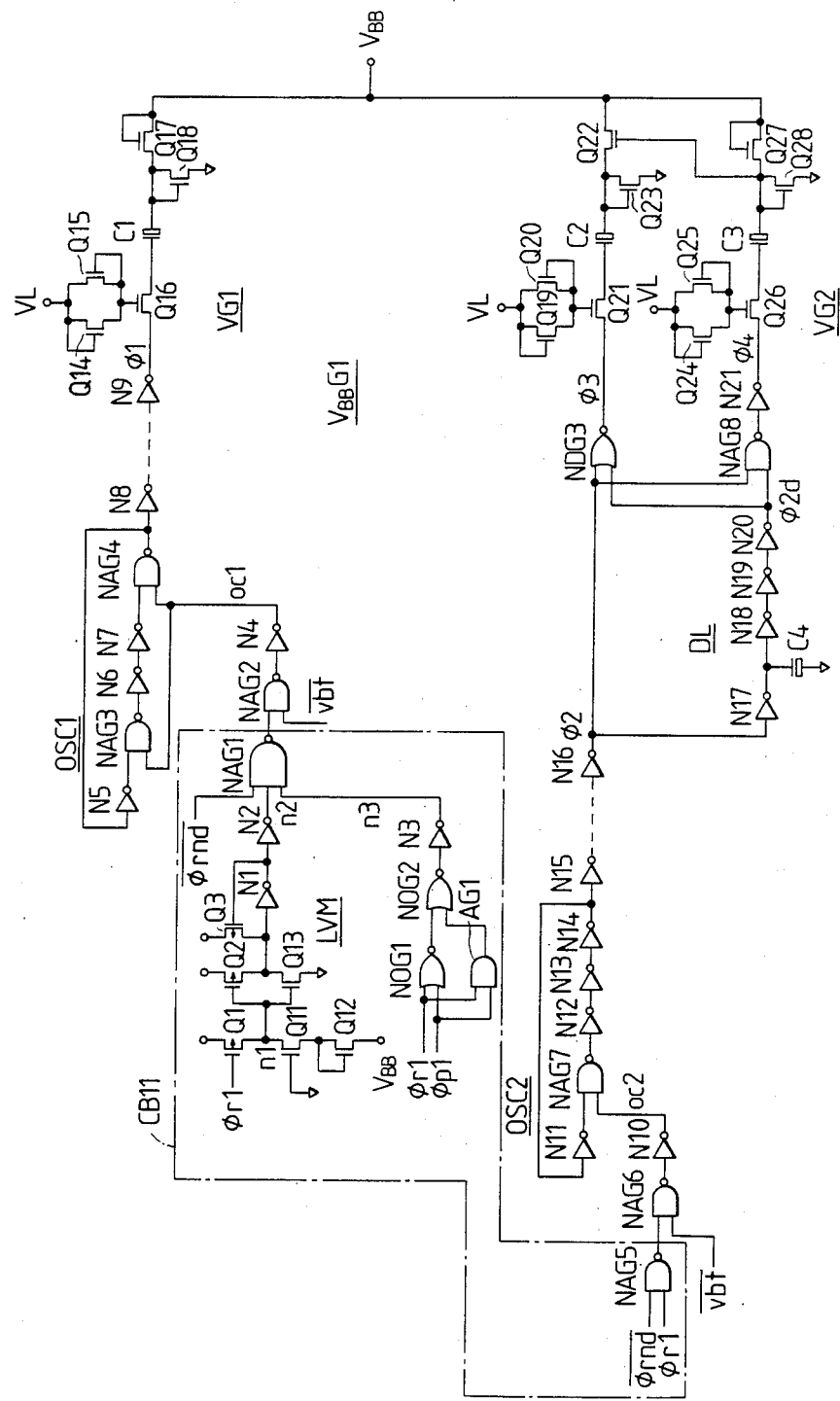
FIG. 1 is a circuit diagram of a substrate back bias voltage generator of a dynamic type RAM as an embodiment of the invention
Figure 3:
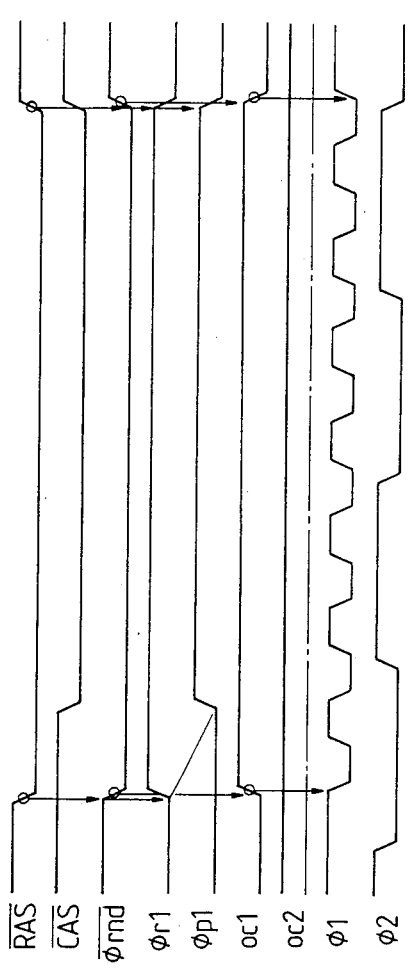
FIG. 3 is a timing chart illustrating an embodiment of ordinary operation mode of the dynamic type RAM in FIG. 2.
Figure 4:
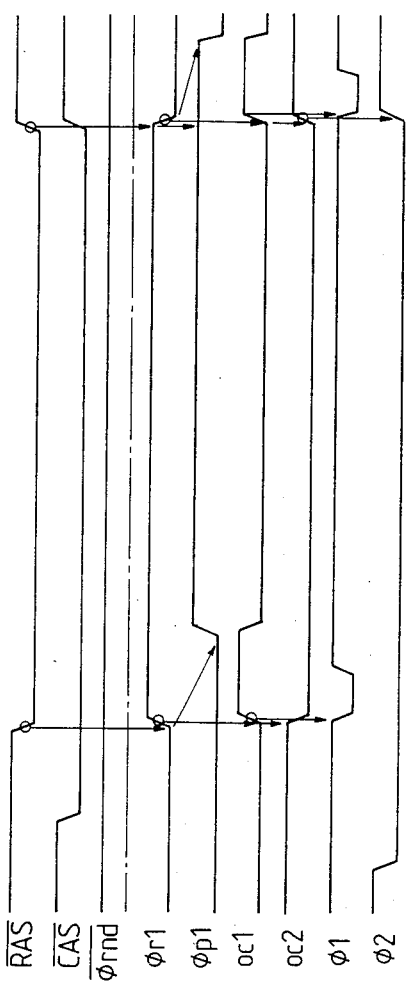
FIG. 4 is a timing chart illustrating an embodiment of CAS before RAS refresh mode of the dynamic type RAM in FIG. 2.
Figure 5:
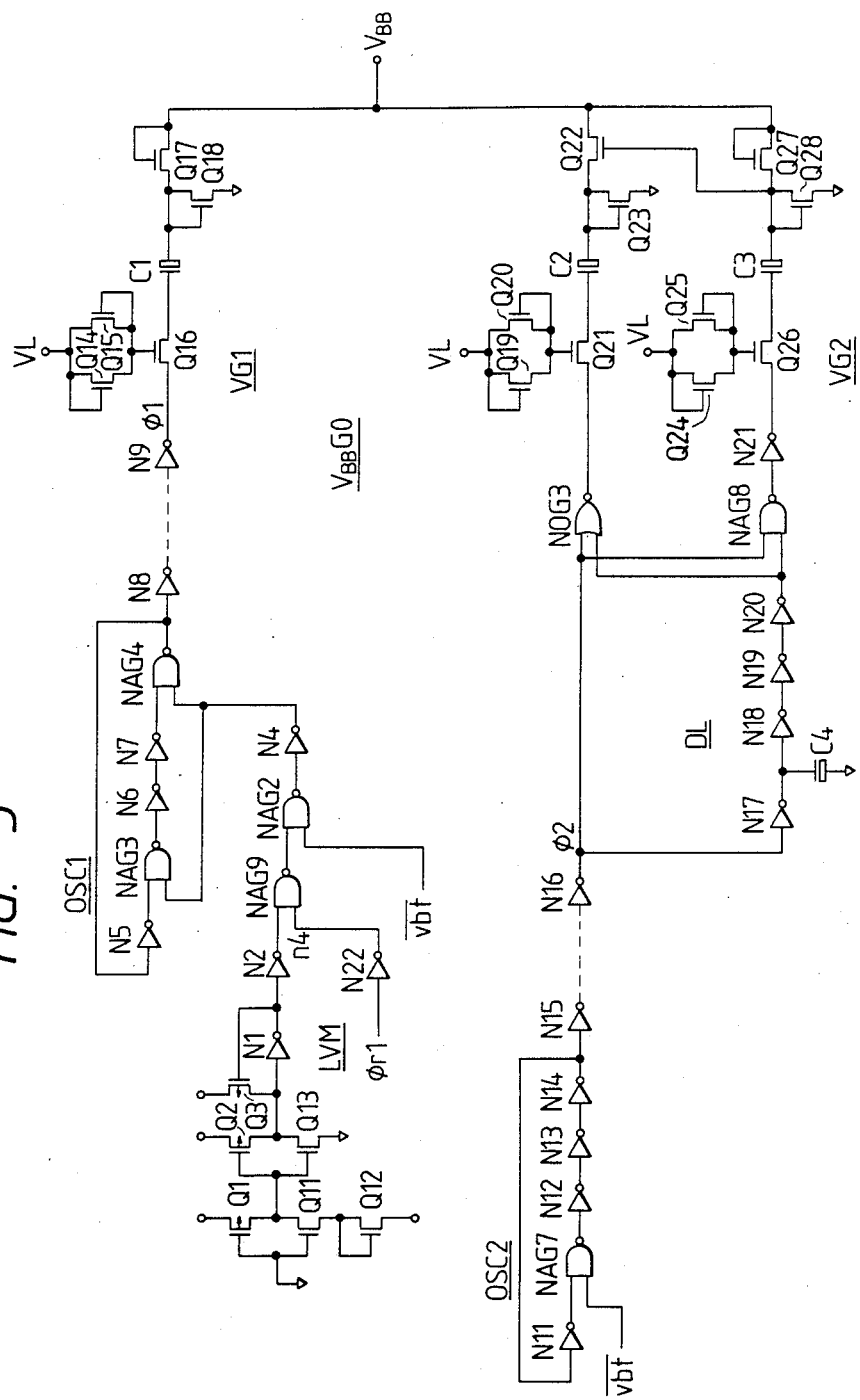
FIG. 5 is a circuit diagram illustrating a substrate back bias voltage generator developed by the present inventor prior to the present invention.

FIG. 1 is a circuit diagram of an embodiment of the substrate back bias voltage $V_{BB}G1$ of the dynamic type RAM in FIG. 2. FIGS. 3 and 4 are timing charts of an embodiment of the dynamic type RAM in FIG. 2 and the substrate back bias voltage generator $V_{BB}G1$ in FIG. 1 in the normal operation mode state and the $\overline{CAS}$ before $\overline{RAS}$ refresh mode state. In accordance with FIG. 1 as well as FIGS. 3 and 4, the specific circuit constitution of the substrate back bias voltage generator $V_{BB}G1$ of the embodiment and outline of its operation will be described. In FIG. 1, MOSFET with arrow added in channel (back gate) portion is P-channel type, and is distinguished from the N-channel MOSFET without arrow added thereto.

In FIG. 1, the substrate back bias voltage $V_{BB}G1$, although not particularly limited thereto, comprises a voltage generator VG1 (first voltage generator) designed to have relatively large current supply capacity, and an oscillation circuit OSC1 and a level detecting circuit VG1 installed corresponding to the voltage generator VG1. It also comprises a voltage generator VG2 (second voltage generator) designed to have relatively small current supply capacity, and an oscillation circuit OSC2 installed corresponding to the voltage generator VG2.

The level detecting circuit LVM, although not particularly limited thereto, includes P-channel MOSFET Q1 as well as N-channel MOSFETs Q11 and Q12 connected in series between the power source voltage of the circuit and the substrate back bias voltage $V_{BB}$. Gate of the MOSFET Q1 is supplied with the timing signal $\phi$rl from the timing generator TG. The MOS-FET Q11 has its gate connected to the ground potential, and the MOSFET Q12 has its gate and drain commonly connected and is therefore made the diode form.

Commonly connected drain of the MOSFETs Q1 and Q11, i.e., node n1 is connected to an input terminal of an inverter circuit comprising P-channel MOSFET Q2 and N-channel MOSFET Q13. An output terminal of the inverter circuit is connected to an input terminal of an inverter circuit N1 and also to the power source voltage of the circuit through P-channel MOSFET Q3. Output signal of the inverter circuit N1 is supplied to gate of the MOSFET Q3, and is inverted by an inverter circuit N2 and supplied as output signal n2 of the level detecting circuit LVM to a second input terminal of a NAND gate circuit NAG1.

When the dynamic type RAM is rendered the non-selective state, as shown in FIGS. 3 and 4, the row address strobe signal $\overline{RAS}$ is made high level and the timing signal $\phi$rl is made low level. Consequently, the MOSFET Q1 is turned on, and the level detecting circuit LVM is substantially rendered the operation state.

In this case, if the absolute value of the substrate back bias voltage $V_{BB}$ is less than the composite threshold voltage of the MOSFETs Q11 and Q12, the MOSFETs Q11 and Q12 are turned off. Consequently, the potential of the node n1 is made high level being nearly equal to the power source voltage of the circuit, and the output signal of the inverter circuit comprising the MOSFETs Q2 and Q13 is made low level. Thereby the output signal of the inverter circuit N1 is made high level, and the output signal n2 of the level detecting circuit LVM is made low level. Since the output signal of the inverter circuit N1 is made high level, the MOSFET Q3 is turned off and the logical threshold level of the inverter circuit comprising the MOSFETs Q2 and Q13 is made slightly low.

On the other hand, if the absolute value of the substrate back bias voltage $V_{BB}$ is larger than the composite threshold voltage of the MOSFETs Q11 and Q12, the MOSFETs Q11 and Q12 are turned on. Therefore the potential of the node n1 becomes prescribed low level specified by ratio of the conductance of the MOSFET Q1 and the composite conductance of the MOSFETs Q11 and Q12. In this case, the low level of the node n1 is designed lower than the logical threshold level of the inverter circuit comprising the MOSFETs Q2 and Q13. Consequently, the output signal of the inverter circuit comprising the MOSFETs Q2 and Q13 is made high level. Thereby the output signal of the inverter circuit N1 is made low level, and the output signal of the inverter circuit N2, i.e., the output signal n2 of the level detecting circuit LVM is made high level. Since the output signal of the inverter circuit N1 is made low level, the MOSFFT Q3 is turned on and the logical threshold level of the inverter circuit comprising the MOSFETs Q2 and Q13 is made slightly higher.

When the row address strobe signal $\overline{RAS}$ is varied from high level into low level and the dynamic type RAM is rendered the selective state, as shown in FIGS. 3 and 4, the timing signal $\phi$rl is made high level and the MOSFET Q1 is turned off. Consequently, the operation of the level detecting circuit LVM is stopped in the state that the substrate back bias voltage $V_{BB}$ is made sufficiently deep, and the output signal n2 of the level detecting circuit LVM remains high level.

In other words, in the substrate back bias voltage generator $V_{BB}G1$ of the embodiment, when the dynamic type RAM is rendered the non-selective state, the level detecting circuit LVM is rendered the operation state selectively. In the operation state, when the substrate back bias voltage $V_{BB}$ is decreased due to leak or the like and the absolute value is less than the composite threshold voltage of the MOSFETs Q11 and Q12, the output signal n2 of the level detecting circuit LVM is made low level selectively. In the level detecting process of the level detecting circuit LVM, the logic threshold level of the inverter circuit comprising the MOSFETs Q2 and Q13 is made low or high selectively in accordance with the output signal of the inverter circuit N1. Consequently, the level detecting circuit LVM has the hysteresial level discrimination characteristics, and the operation is stabilized.

The first input terminal of the NAND gate circuit NAG1 is supplied with the inverted timing signal $\overline{\phi rnd}$ from the timing generator TG. Also the third input terminal thereof is supplied with the output signal n3 of the inverter circuit N3.

The input terminal of the inverter circuit N3, although not particularly limited thereto, is connected to the output terminal of the NOR gate circuit NOG2. One input terminal of the NOR gate circuit NOG2 is connected to the output terminal of the NOR gate circuit NOG1, and other input terminal thereof is connected to the output terminal of the AND gate circuit AG1. One input terminal of the NOR gate circuit NOG1 and the AND gate circuit AG1 is supplied with the timing signal $\phi rl$ commonly from the timing generator TG, and other input terminal thereof is supplied with the timing signal $\phi pl$ commonly. Thereby the output signal n3 of the inverter circuit N3 is made low level temporarily, when the output signals of the NOR gate circuit NOG1 and the AND gate circuit AG1 are made low level, in other words, while the dynamic type RAM is rendered the selective state and the timing signal $\phi rl$ is made high level and then the timing signal $\phi pl$ is made high level, or while the timing signal $\phi rl$ is made low level and then the timing signal $\phi pl$ is made low level.

The output signal of the NAND gate circuit NAG1 is supplied to one input terminal of the NAG2. Other input terminal of the NAND gate circuit NAG2 is supplied with the inverted inner control signal $\overline{vbt}$. The output signal of the NAND gate circuit NAG2 is inverted by the inverter circuit N4, and supplied as an oscillation circuit control signal ocl to other input terminal of the NAND gate circuits NAG3 and NAG4 constituting the oscillation circuit OSC1.

From these circumstances, the oscillation circuit control signal ocl is made high level selectively, when the output signal of the NAND gate circuit NAG1 is made high level, i.e., when any of the inverted timing signal $\overline{\phi rnd}$ or the output signal n2 of the level detecting circuit LVM or the output signal n3 of the inverter circuit N3 is made low level, on the condition that the inverted inner control signal $\overline{vbt}$ is high level. AS above described, the output signal n2 of the level detecting circuit LVM is made low level selectively, when the dynamic type RAM is rendered the non-selective state and the absolute value of the substrate back bias voltage $V_{BB}$ is less than the composite threshold voltage of the MOSFETs Q11 and Q12. The inverted timing signal $\overline{\phi rnd}$, as shown in FIG. 3, is made low level selectively, when the dynamic type RAM is rendered the selective state in ordinary operation mode. In other words, as shown in FIG. 4, it remains high level when the dynamic type RAM is rendered the selective state in the $\overline{CAS}$ before $\overline{RAS}$ refresh mode. Further the output signal n3 of the inverter circuit N3 is made low level temporarily, while the dynamic type RAM is rendered the selective state and the timing signal $\phi rl$ is made high level and then the timing signal $\phi pl$ is made high level.

Consequently, the oscillation circuit control signal ocl is made high level temporarily, (1) when the dynamic type RAM is rendered the non-selective state and the absolute value of the substrate back bias voltage $V_{BB}$ is less than the specified value, i.e., the composite threshold voltage of the MOSFETs Q11 and Q12, (2) when the dynamic RAM is rendered the selective state in ordinary operation mode as shown in FIG. 3, and (3) when the dynamic type RAM is rendered the selective state in the $\overline{CAS}$ before $\overline{RAS}$ refresh mode as shown in FIG. 4, while the timing signal $\phi rl$ is made high level and then the timing signal $\phi pl$ is made high level or while the timing signal $\phi rl$ is made low level and then the timing signal $\phi pl$ is made low level.

Of course, when the dynamic type RAM is rendered the substrate back bias voltage examination mode and the inverted inner control signal $\overline{vbt}$ is made low level, the oscillation circuit control signal ocl is fixed to the low level irrespective of the above-mentioned items (1)-(3). Also, as hereinafter described, the period while the timing signal $\phi rl$ is made high level or low level and then the timing signal $\phi pl$ is made high level or low level, although not particularly limited thereto, is made one cycle of the oscillation period of the oscillation circuit OSC1.

The oscillation circuit OSC1, although not particularly limited thereto, comprises three inverter circuits N5-N7 in series connection, and NAND gate circuits NAG3 and NAG4. An output terminal of the NAND gate circuit NAG4 is connected to an input terminal of the inverter circuit N5. Other input terminals of the NAND gate circuits NAG3 and NAG4 are supplied with the oscillation circuit control signal ocl as above described. Thereby the inverter circuits N5-N7 as well as the NAND gate circuits NAG3 and NAG4 functions as one ring oscillator on the condition that the oscillation circuit control signal ocl is high level. In this case, the oscillation frequency of the oscillation circuit OSC1 is made relatively high, for example, 4 MHz.

Output signal of the NAND gate circuit NAG4 is multiplied in its drive capacity by inverter circuits N8-N9 of the even number in series connection, and supplied as output signal of the oscillation circuit OSC1, i.e., pulse signal $\phi 1$ to the voltage generator VG1.

The voltage generator VG1 has a boost capacity C1 as the basic constitution designed to have relatively large electrostatic capacity. One electrode of the boost capacity C1 is supplied with the pulse signal $\phi 1$ from the oscillation circuit OSC1 through N-channel MOSFET Q16. Gate of the MOSFET Q16, although not particularly limited thereto, is connected through N-channel MOSFETs Q14 and Q15 in parallel connection to the prescribed constant voltage VL. In these MOSFETs Q14 and Q15, gate and drain are commonly connected respectively so as to have the diode characteristics in reverse directions from each other. Therefore the gate voltage Vg16 of the MOSFET Q16 is clamped in range that $$VL - VTH14 < Vg16 < VL + VTH15$$

wherein threshold voltages of the MOSFETs Q14 and Q15 are made VIH14 and VTH15 respectively. As a result, the substrate back bias voltage $V_{BB}$ can be prevented from becoming the abnormal level due to variation of the power source voltage of the circuit or the like.

N-channel MOSFET Q17 in diode form is installed between other electrode of the boost capacity C1 and the substrate back bias voltage supply point $V_{BB}$. N-channel MOSFET Q18 also in diode form is installed between other electrode of the boost capacity C1 and the ground potential of the circuit. In this case, the MOSFETs Q17 and Q18 are designed to have nearly equal threshold voltage VTH. The MOSFET Q17 is turned on selectively when the potential of other electrode of the boost capacity C1 is lower than the substrate back bias voltage $V_{BB}$ by the threshold voltage or more, and the MOSFET Q18 is turned on selectively when the potential of other electrode of the boost capacity C1 is higher than the ground potential of the circuit by the threshold voltage or more.

When the pulse signal $\phi 1$ is made high level and one electrode of the boost capacity C1 is made high level, the high level is induced in other electrode of the boost capacity C1 by the charge pump action. In this case, however, since the MOSFET Q18 is turned on, the level is clamped to the threshold voltage $V_{TH}$ of the MOSFET Q18. On the other hand, when the pulse signal $\phi 1$ is varied to low level, the potential of other electrode of the boost capacity C1 is reduced by the power source voltage Vcc of the circuit and becomes $-(Vcc - V_{TH})$. Therefore the substrate back bias voltage $V_{BB}$ becomes voltage higher than the potential of other electrode of the boost capacity C1 by the threshold voltage VTH, i.e., $-(Vcc - 2 \times V_{TH})$.

As above described, the boost capacity C1 installed in the voltage generator VG1 is designed to have relatively large electrostatic capacity. Therefore the charage quantity delivered to the substrate back bias voltage supply point $V_{BB}$ by the charge pump action of the boost capacity C1 as above described becomes relatively large value. As a result, the voltage generator VG1 has relatively large current supply capacity. Further, as above described, the oscillation circuit OSC1 is rendered the operation state selectively, when the dynamic type RAM is rendered the non-selective state and the absolute value of the substrate back bias voltage $V_{BB}$ is the prescribed value or less or when the dynamic type RAM is rendered the selective state in ordinary operation mode. Since the current supply capacity of the voltage generator VG1 is made large, the level of the substrate back bias voltage is rapidly restored, and also maintained stably in the ordinary operation mode where the level variation is relatively large. When the dynamic type RAM is rendered the selective state in the $\overline{CAS}$ before $\overline{RAS}$ refresh mode where the level variation of the substrate back bias voltage $V_{BB}$ is relatively little, the oscillation circuit OSC1 is rendered the operation state in single shot as above described. As a result, the level correction of the substrate back bias voltage $V_{BB}$ is performed only by required amount for a time, and the operation current is reduced. After the $\overline{CAS}$ before $\overline{RAS}$ refresh mode is finished, the oscillation circuit OSC1 is rendered the operation state in single shot in response to the rise timing of the signal $\overline{RAS}$. This is performed to prevent that the absolute value of the substrate back bias voltage $V_{BB}$ is reduced undesirably during the precharge operation of the dynamic circuit performed at the high level state of the signal $\overline{RAS}$.

On the other hand, an oscillation circuit OSC2 installed corresponding to the voltage generator VG2 of the substrate back bias voltage generator $V_{BB}$ G comprises four inverter circuits N11–N14 in series connection and a NAND gate circuit NAG7 in similar manner to the oscillation circuit OSC1. An output terminal of the inverter circuit N14 is connected to an input terminal of the inverter circuit N11. Other input terminal of the NAND gate circuit NAG7 is supplied with output signal of an inverter circuit N10, i.e., oscillation circuit control signal oc2. Thereby the inverter circuits N11–N14 and the NAND gate circuit NAG7 function as one ring oscillator on the condition that the oscillation circuit control signal oc2 is high level. In this case, the oscillation frequency of the oscillation circuit OSC2 is made relatively low, for example, 1 MHz.

An input terminal of the inverter circuit N10, although not particularly limited thereto, is connected to an output terminal of a NAND gate circuit NAG6. One input terminal of the NAND gate circuit NAG6 is connected to an output terminal of a NAND gate circuit NAG5, and other input terminal thereof is supplied with the inverted inner control signal $\overline{vbt}$. One input terminal of the NAND gate circuit NAG5 is supplied with the inverted timing signal $\overline{\phi rnd}$, and other input terminal thereof is supplied with the timing signal $\phi rl$.

From these circumstances, output signal of the inverter circuit N10, i.e., the oscillation circuit control signal oc2 is made high level selectively, when the output signal of the NAND gate circuit NAG5 is made high level, i.e., when any of the inverted timing signal $\overline{\phi rnd}$ or the timing signal $\phi rl$ is made low level, in other words, as shown in FIG. 3, when the dynamic type RAM is rendered the selective state in ordinary operation mode and the inverted timing signal $\overline{\phi rnd}$ is made low level or when the dynamic type RAM is rendered the non-selective state and the timing signal $\phi rl$ is made low level, on the condition that the inverted inner control signal $\overline{vbt}$ is high level. Speaking this reversely, the oscillation circuit control signal oc2, as shown in FIG. 4, is made low level, when the dynamic type RAM is rendered the selective state in the $\overline{CAS}$ before $\overline{RAS}$ refresh mode and both the inverted timing signal $\overline{\phi rnd}$ and the timing signal $\phi rl$ are made high level. As a result, the operation of the oscillation circuit OSC2 is stopped selectively, when the dynamic type RAM is rendered the selective state in the $\overline{CAS}$ before $\overline{RAS}$ refresh mode. Of course, when the dynamic type RAM is rendered the substrate back bias voltage examination mode and the inverted inner control signal $\overline{vbt}$ is made low level, the oscillation circuit control signal oc2 is fixed to the low level irrespective of the above-mentioned condition and the operation of the oscillation circuit OSC2 is stopped.

Output signal of the inverter circuit N14 is multiplied in its drive capacity by inverter circuits N15–N16 of the even number in series connection, and then supplied as output signal of the oscillation circuit OSC2, i.e., pulse signal 2 to the voltage generator VG2.

The voltage generator VG2, although not particularly limited thereto, includes two charge pump circuits having boost capacity of C2 and C3 as the basic constitution respectively.

Among these, the charge pump circuit having the boost capacity C2 as the basic constitution is supplied with output signal of a NOR gate circuit NOG3, i.e., pulse signal $\phi 3$. One input terminal of the NOR gate circuit NOG3 is supplied with the pulse signal $\phi 2$ from the oscillation circuit OSC2, and other input terminal thereof is supplied with delay signal of the pulse signal $\phi 2$ by a delay circuit DL, i.e., pulse signal $\phi 2d$. On the other hand, the charge pump circuit having the boost capacity C3 as the basic constitution is supplied with inverted signal of output signal of a NAND gate circuit NAG8 by an inverter circuit N21, i.e., pulse signal $\phi 4$. One input terminal of the NAND gate circuit NAG8 is supplied with the pulse signal $\phi 2$, and other input termianl thereof is supplied with the pulse signal $\phi 2d$.

The delay circuit DL, although not particularly limited thereto, comprises an inverter circuit N17 receiving the pulse signal $\phi 2$, a capacitor C4 installed between the output terminal of the inverter circuit N17 and the ground potential of the circuit, and three inverter circuits N18–N20 in series connection.

Output signal of the NOR gate circuit NOG3, i.e., pulse signal $\phi 3$ is made high level selectively when both pulse signals $\phi 2$ and $\phi 2d$ are made low level. Also output signal of the inverter circuit N21, i.e., pulse signal $\phi 4$ is made high level selectively when both pulse signals $\phi 2$ and $\phi 2d$ are made high level. In other words, the pulse signals $\phi 3$ and $\phi 4$ are made high level complementarily so that both are not made high level simultaneously.

The pulse signal $\phi 3$, although not particularly limited thereto, is supplied through N-channel MOSFET Q21 to one electrode of the boost capacity C2. A clamp circuit comprising N-channel MOSFETs Q19 and Q20 is installed between gate of the MOSFET Q21 and the constant voltage VL. N-channel MOSFET Q22 is installed between other electrode of the boost capacity C2 and the substrate back bias voltage supply point $V_{BB}$. Also N-channel MOSFET Q23 in diode form is installed between other electrode of the boost capacity C2 and the ground potential of the circuit.

Also the pulse signal $\phi 4$ is supplied through N-channel MOSFET Q26 to one electrode of the boost capacity C3. A clamp circuit comprising N-channel MOSFETs Q24 and Q25 is installed between gate of the MOSFET Q26 and the constant voltage VL. N-channel MOSFET Q27 in diode form is installed between other electrode of the boost capacity C3 and the substrate back bias voltage supply point $V_{BB}$. Also N-channel MOSFET Q28 in diode form is installed between other electrode of the boost capacity C3 and the ground potential of the circuit. Gate of the MOSFET Q22 is connected to other electrode of the boost capacity C3.

In this case, the boost capacity C2 is designed to have smaller electrostatic capacity than the boost capacity $C_1$ installed in the voltage generator VG1, and the boost capacity C3 is designed to have further smaller electrostatic capacity than the boost capacity C2. The MOSFETs Q22 and Q23 as well as Q27 and Q28 are designed to have nearly the same threshold voltage $V_{TH}$ as that of the MOSFETs Q17 and Q18 in the voltage generator VG1.

The charge pump circuit having the boost capacity C3 as the basic constitution functions in similar operation to the voltage generator VG1 so that the drain potential of the MOSFET Q27, i.e., the substrate back bias voltage $V_{BB}$ becomes $-(Vcc-2\times VTH)$. On the other hand, when the potential of other electrode of the boost capacity C2 becomes $-(Vcc-V_{TH})$ due to low level of the pulse signal $\phi 3$ and also the potential of other electrode of the boost capacity C3 becomes $+V_{TH}$ due to high level of the pulse signal $\phi 4$, the MOSFET Q10 is turned on selectively, and the charge pump circuit having the boost capacity C2 as the basic constitution functions so that value of the substrate back bias voltage $V_{BB}$ becomes $-(Vcc-VTH)$. As above described, the boost capacity C2 is designed to have the large electrostatic capacity in comparison to the boost capacity C3. Therefore when the dynamic type RAM is rendered the non-selective state and only the voltage generator VG2 is rendered the operation state, value of the back bias voltage $V_{BB}$ is made $-(Vcc-V_{TH})$.

When the dynamic type RAM is rendered the non-selective state and only the voltage generator VG2 having relatively small current supply capacity is rendered the operation state, nearly constant leak current flows in the substrate of the dynamic type RAM. Consequently, the substrate back bias voltage $V_{BB}$ is decreased in the absolute value by the leak current, and is substantially made about $-(Vcc-2\times V_{TH})$. As a result, when the dynamic type RAM is varied from the non-selective state into the selective state, since the level variation of the substrate back bias voltsge $V_{BB}$ is compressed, the operation of the dynamic type RAM is more stabilized.

As above described, the boost capacity C2 and C3 installed in the voltage generator VG2 are designed to have relatively small electrostatic capacity. Consequently, the charge quantity delivered to the substrate back bias voltage supply point $V_{BB}$ by the charge pump action of the boost capacity C2 and C3 becomes relatively small value. As a result, the voltage generator VG2 has relatively small current supply capacity. Further, as above described, the oscillation circuit OSC2 is rendered the operation state selectively, when the dynamic type RAM is rendered the non-selective state or when the dynamic type RAM is rendered the selective state in ordinary operation mode. In this case, since the substrate back bias voltage $V_{BB}$ may be corrected only in the variation amount due to the leak current, the operation current of the substrate back bias voltage generator $V_{BB}G$ is significantly reduced. On the other hand, the operation of the oscillation circuit OSC2 is stopped selectively, when the dynamic type RAM is rendered the selective state in the $\overline{CAS}$ before $\overline{RAS}$ refresh mode. As a result, the operation current of the substrate back bias voltage generator $V_{BB}G$ in the $\overline{CAS}$ before $\overline{RAS}$ refresh mode is further reduced in cooperation with the voltage generator VG1 in single shot. Thereby the dynamic type RAM incorporating the substrate back bias voltage generator $V_{BB}G$ is realized further in the low consumption power.

As above described, the dynamic type RAM of the embodiment incorporates the substrate back bias voltage generator $V_{BB}G1$. The substrate back bias voltage generator $V_{BB}G1$ comprises the voltage generator VG1 having relatively large current supply capacity, and the voltage generator VG2 having relatively small current supply capacity. In the embodiment, the voltage generator VG1 is rendered the operation state continuously in accordance with the pulse signal $\phi 1$ outputted from the corresponding oscillation circuit OSC1, when the dynamic type RAM is rendered the non-selective state and the absolute value of the substrate back bias voltage $V_{BB}$ is the specified value or less or when the dynamic type RAM is rendered the selective state in normal operation mode, and the operation number is limited to one time when the dynamic type RAM is rendered the selective state in the $\overline{CAS}$ before $\overline{RAS}$ refresh mode. The operation number is not always limited to one time, but may be two times or more. On the other hand, the voltage generator VG2 is rendered the operation state continuously in accordance with the pulse signal $\phi 2$ outputted from the corresponding oscillation circuit OSC2, when the dynamic type RAM is rendered the non-selective state or when the dynamic type RAM is rendered the selective state in ordinary operation state, and the operation is stopped when the dynamic type RAM is rendered the selective state in the $\overline{CAS}$ before $\overline{RAS}$ refresh mode. In other words, in the prior art, the substrate back bias voltage generator $V_{BB}G$ is rendered the operation state irrespective of the operation mode when the dynamic type RAM is rendered the selective state. In the embodiment, however, when the dynamic type RAM is rendered the selective state in the $\overline{CAS}$ before $\overline{RAS}$ refresh mode where the level variation of the substrate back bias voltage $V_{BB}$ is relatively little, the operation number is particularly limited or the operation is particularly stopped. As a result, the average operation current of the substrate back bias voltage $V_{BB}G$ is reduced, and the consumption power of the dynamic type RAM is significantly reduced. Thereby, for example, the dynamic type RAM of super low consumption power to be used for battery backup can be realized.

As shown in the embodiment, when the invention is stopped to the semiconductor memory device of the dynamic type RAM or the like incorporating the substrate back bias voltage generator, following effects can be obtained.

(1) The substrate back bias voltage generator comprises the first voltage generator having relatively large current supply capacity and the second voltage generator having relatively small current supply capacity, when the dynamic type RAM is rendered the ordinary operation mode or when the dynamic type RAM is rendered the non-selective state and the absolute value of the substrate back bias voltage is the specified value or less, the first voltage generator is rendered the operation state selectively, and for example, when the dynamic type RAM is rendered the selective state in the $\overline{CAS}$ before $\overline{RAS}$ refresh mode, the operation number of the first voltage generator is limited and the operation of the second voltage generator is stopped, thereby effect is obtained in that the operation current of the substrate back bias voltage generator can be reduced selectively in the $\overline{CAS}$ before $\overline{RAS}$ refresh mode where the level variation of the substrate back bias voltage is relatively little.

(2) According to item (1), refresh of the dynamic type RAM is performed in the $\overline{CAS}$ before $\overline{RAS}$ refresh mode, thereby effect is obtained in that the average operation current of the substrate back bias voltage generator can be reduced.

(3) According to items (1) and (2), effect is obtained in that the consumption power of the dynamic type RAM incorporating the substrate back bias voltage generator can be significantly reduced.

(4) According to items (1)-(3), effect is obtained in that the dynamic type RAM of super low consumption power incorporating the substrate back bias voltage generator and being used for battery backup can be realized.

The invention performed by the present inventor has been specifically described based on the embodiment. However, the invention is not limited to the embodiment but it is obvious that various changes and modifications may be made without departing from the spirit and the scope of the invention. For example, in FIG. 1, the operation number of the voltage generator VG1 in the $\overline{CAS}$ before $\overline{RAS}$ refresh mode of the dynamic type RAM need not be particularly one time. Also the voltage generator VG2 may not include the two charge pump circuit but may not include the two charge pump circuit but may be constituted by one charge pump circuit in similar manner to the voltage generator VG1. In the level detecting circuit LVM, for example, one or plural N-channel MOSFETs in diode form may be further added in series to the MOSFETs Q11 and Q12, thereby the absolute value of the discrimination level to the substrate back bias voltage $V_{BB}$ can be increased. The logical condition to form the oscillation circuit control signals oc1 and oc2 can be realized variously by suitable combination of the timing signals. The voltage generators VG1 and VG2 may not include the clamp circuit. In FIG. 2, the memory array MARY may be constituted by a plurality of memory mats, or the storage data may be inputted or outputted in unit of plural bits. The refresh mode may be assigned, for example, by exclusive refresh control signal. In this case, the operation of the substrate back bias voltage generator may be limited in accordance with the refresh control signal, thereby the low consumption power in all refresh mode can be realized. When the dynamic type RAM has other operation mode where the level variation of the substrate back bias voltage is relatively little, similar effect can be obtained regarding such operation mode. Further, various embodying style may be taken in specific circuit constitution of the substrate back bias voltage generator shown in FIG. 1, and the block constitution of the dynamic RAM shown in FIG. 2 as well as combination of control signal, address signal and timing signal shown in FIGS. 3 and 4.

Figure 7:
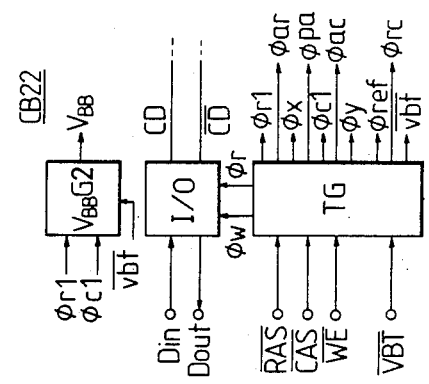
FIG. 7 is a block diagram illustrating an embodiment of main part of a dynamic type RAM including the substrate back bias voltage generator in FIG. 6.

FIG. 7 shows main part of the dynamic type RAM to which the invention is applied in order to attain the second object. In the dynamic type RAM shown in FIG. 2, the circuit block CB21 is relaced by the circuit block CB22 shown in FIG. 7, thereby the block diagram of the dynamic type RAM as the second embodiment of the invention is constituted.

The dynamic type RAM of the embodiment incorporates a substrate back bias voltage generator $V_{BB}G2$ receiving the power source voltage of the circuit and forming the prescribed substrate back bias voltage $V_{BB}$. The substrate back bias voltage generator $V_{BB}G2$ comprises a voltage generator VG1 having relatively large current supply capacity, and a voltage generator VG2 having relatively small current supply capacity. In the embodiment, the voltage generators VG1 and VG2, although not particularly limited thereto, are rendered the operation state selectively in accordance with combination of row address strobe signal $\overline{RAS}$ and column address strobe signal $\overline{CAS}$ supplied as the starting control signals. That is, the voltage generators VG1 and VG2 are rendered the operation state irrespective of the level of the column address strobe signal $\overline{CAS}$ when the row address strobe signal $\overline{RAS}$ is made low level, and the operation is stopped when the row address strobe signal $\overline{RAS}$ is made high level and the column address strobe signal $\overline{CAS}$ is made low level. Also when both the row address strobe signal $\overline{RAS}$ and the column address strobe signal $\overline{CAS}$ are made high level, the voltage generator VG1 is rendered the operation state selectively at the level of the substrate back bias voltage being the prescribed value or less, and the voltage generator VG2 is rendered the operation state irrespective of the level of the substrate back bias voltage. That is, the operation of the substrate back bias voltage generator is stopped selectively in prescribed combination of the row address strobe signal $\overline{RAS}$ and the column address strobe signal $\overline{CAS}$. In the embodiment, the period that the substrate back bias voltage generator is rendered the operation state or the operation is stopped, can be specified as the user specification in accordance with the examination results of the dynamic typr RAM. As a result, the user of the dynamic type RAM can stop the operation of the substrate back bias voltage generator or control and suppress the operation current in range that the operation of the dynamic type RAM is not obstructed.

In the dynamic type RAM of the embodiment, the substrate back bias voltage generator $V_{BB}G2$ is supplied with timing signal $\phi rl$ and $\phi cl$ from a timing generator TG as well as inverted inner control signal $\overline{vbt}$. In this case, the timing signal $\phi rl$, although not particularly limited thereto, is made low level selectively when the row address strobe signal $\overline{RAS}$ is made low level. Also the timing signal $\phi cl$ is made high level selectively when column address strobe signal $\overline{CAS}$ is made low level. Further, the inverted inner control signal $\overline{vbt}$, although not particularly limited thereto, is normally made high level, and is made low level selectively when the examination control signal $\overline{VBT}$ is made low level and the dynamic type RAM is rendered the substrate back bias voltage examination mode.

The substrate back bias voltage generator $V_{BB}G2$, as later described, forms the substrate back bias voltage $V_{BB}$ being the prescribed negative voltage based on the power source voltage of the circuit and supplies it to the semiconductor substrate of the dynamic type RAM. Thereby the parasitic capacity value existing between the semiconductor substrate and each circuit element, and the operation of the dynamic type RAM is stabilized.

In the embodiment, the substrate back bias voltage generator $V_{BB}G2$ comprises a voltage generator VG1 having relatively large current supply capacity and a voltage generator VG2 having relatively small current supply capacity, in similar manner to the above-mentioned substrate back bias voltage generator $V_{BB}G1$. These voltage generators are rendered the operation state selectively in the prescribed combination in accordance with the timing signals $\phi rl$ and $\phi cl$. Also the operation is stopped selectively when the inverted inner control signal $\overline{vbt}$ is made low level. Thereby the operation characteristics of the dynamic type RAM can be tested when the substrate back bias voltage $V_{BB}$ is not supplied.

The specific circuit constitution of the substrate back bias voltage generator $V_{BB}G2$ and the operation thereof will be hereinafter described in detail.

The timing generator TG forms the various sorts of timing signals and the inner control signals based on the row address strobe signal $\overline{RAS}$, the column address strobe signal $\overline{CAS}$, the write enable signal $\overline{WE}$ and the examination control signal $\overline{VBT}$ supplied as starting control signals from the outside, and supplies them to each circuit of the dynamic type RAM.

Figure 6:
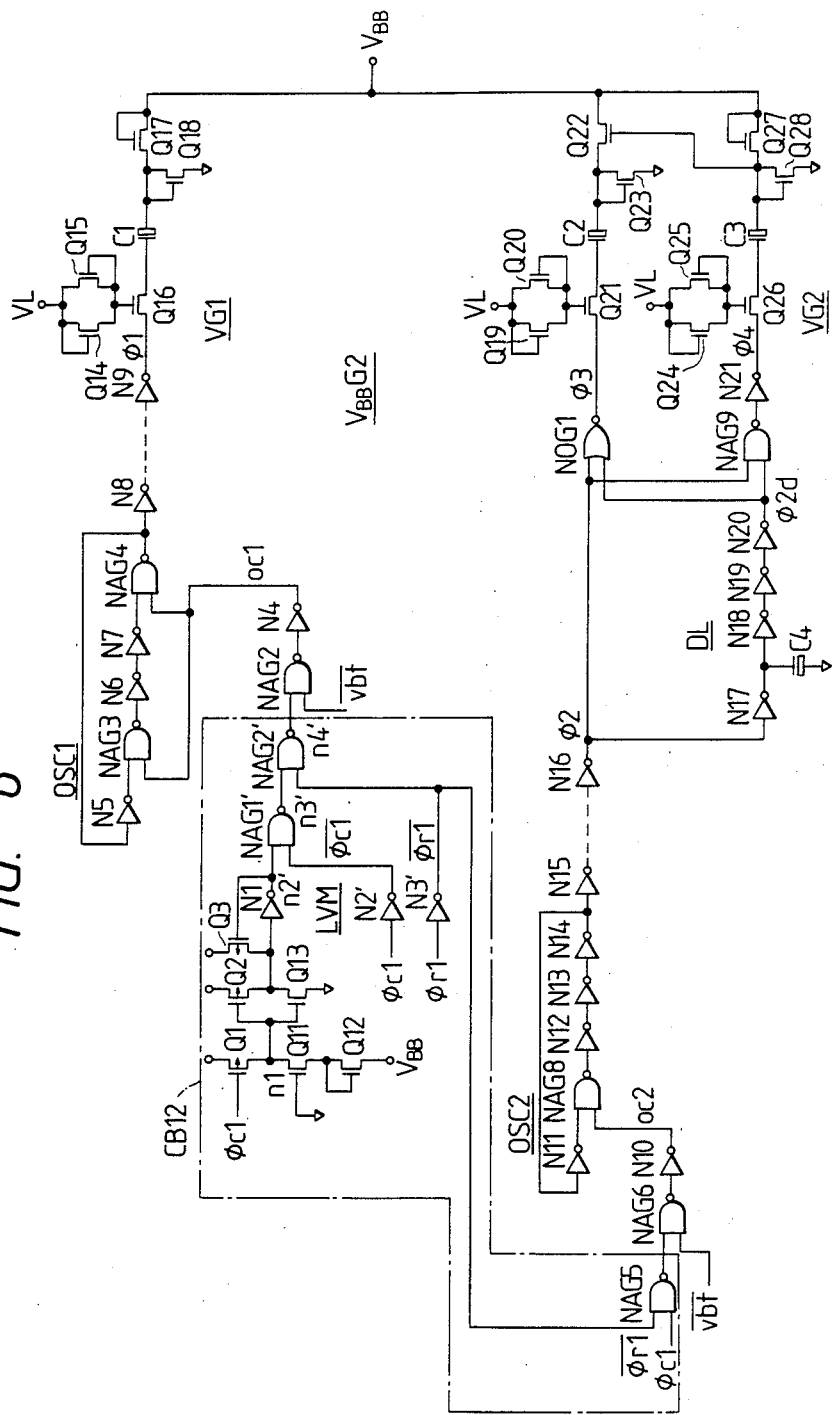
FIG. 6 is a circuit diagram of a substrate back bias voltage generator of a dynamic type RAM as another embodiment of the invention.
Figure 8:
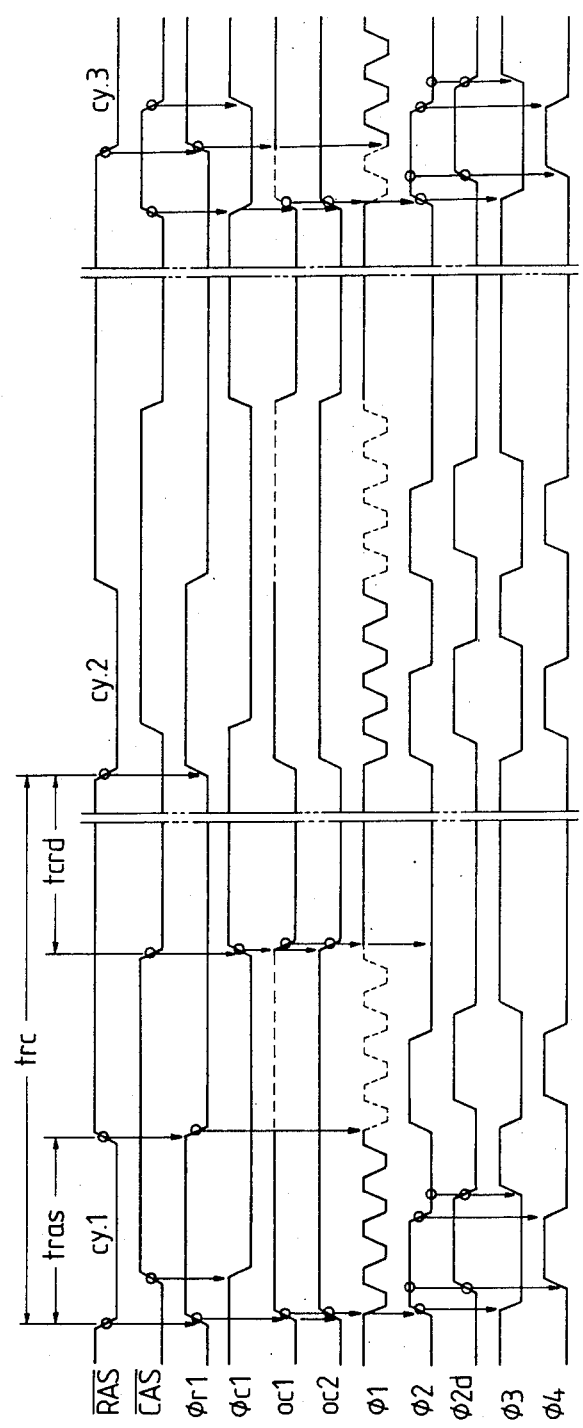
FIG. 8 is a timing chart illustrating an embodiment of the substrate back bias voltage generator in FIG. 6.

FIG. 6 is a circuit diagram of an embodiment of the substrate back bias voltage generator $V_{BB}G2$ in FIG. 7. FIG. 8 is a timing chart of an embodiment of the substrate back bias voltage generator $V_{BB}G2$ in FIG. 6. In accordance with these figures, the specific circuit constitution of the substrate back bias voltage generator $V_{BB}G2$ of the embodiment and outline of its operation will be described. The basic constitution of the substrate back bias voltage generator $V_{BB}G2$ is the same as that of the substrate back bias voltage generator $V_{BB}G1$ shown in FIG. 1. That is, difference between both members exists only in the circuit block CB11 shown in FIG. 1 and the circuit block CB12 shown in FIG. 6. Consequently, in FIG. 6, the description centers on the circuit block CB12. FIG. 8 exemplifies three memory cycles cy. 1–cy. 3 executed continuously. Among these, the dynamic type RAM is rendered the $\overline{CAS}$ before $\overline{RAS}$ refresh mode in the cycles Cy. 1 and Cy. 2, and rendered the ordinary write mode or read mode in the cycle Cy. 3. In FIG. 8, the oscillation circuit control signal ocl and the pulse signal $\phi 1$ are shown in dotted line while the voltage generator VG1 of the substrate back bias voltage generator is rendered the operation state selectively in accordance with the level of the substrate back bias voltage $V_{BB}$.

The level detecting circuit LVM, although not particularly limited thereto, includes P-channel MOSFET Q1 as well as N-channel MOSFETs Q11 and Q12 connected in series between the power source voltage of the circuit and the substrate back bias voltage $V_{BB}$. Gate of the MOSFEI Q1 is supplied with the timing signal $\phi rl$ from the timing generator TG. The MOSFET Q11 has its gate connected to the ground potential, and the MOSFET Q12 has its gate and drain commonly connected and is therefore made the diode form.

Commonly connected drain of the MOSFETs Q1 and Q11, i.e., node $n_1$ is connected to an input terminal of an inverter circuit comprising P-channel MOSFET Q2 and N-channel MOSFET Q13. An output terminal of the inverter circuit is connected to an input terminal of an inverter circuit N1 and also to the power source voltage of the circuit through P-channel MOSFET Q3. Output signal of the inverter circuit N1 is supplied as output signal n2 of the level detecting circuit LVM to one input terminal of a NAND gate circuit NAG1, and also supplied to gate of the MOSFET Q3.

The dynamic type RAM, as shown in FIG. 8, is rendered the selective state selectively when the row address strobe signal $\overline{RAS}$ is made low level. The timing signal $\phi rl$ is made high level selectively, when the dynamic type RAM is rendered the selective state and therefore the row address strobe signal $\overline{RAS}$ is made low level. On the other hand, the column address strobe signal $\overline{CAS}$ is made low level in slightly delaying from the row address strobe signal $\overline{RAS}$ when the dynamic typr RAM is rendered the ordinary operation mode, and made low level prior to the row address strobe signal $\overline{RAS}$ when the dynamic type $\overline{RAM}$ is rendered the $\overline{CAS}$ before $\overline{RAS}$ refresh mode. When the dynamic type RAM is rendered the non-selective state, the column address strobe signal is made high level or low level during the prescribed period with the intention on the reason as hereinafter described. The timing signal $\phi cl$ is made high level selectively when the column address strobe signal $\overline{CAS}$ is made low level.

When the column address strobe signal $\overline{CAS}$ is made high level and the timing signal $\phi cl$ is made low level, in the level detecting circuit LVM of the substrate back bias voltage generator of FIG. 6, the MOSFET Q1 is turned on. Therefore the level detecting circuit LVM is rendered the operation state, and performs the level discrimination operation of the substrate back bias voltage $V_{BB}$.

When the column address strobe signal $\overline{CAS}$ is made low level and the timing signal $\phi c1$ is made high level, the MOSFET Q1 of the level detecting circuit LVM is turned off. As a result, the level detecting circuit LVM is rendered the non-operation state, and the detection current flowing through the MOSFETs Q11 and Q12 into the substrate back bias voltage common point $V_{BB}$ is completely interrupted.

In other words, in the substrate back bias voltage generator $V_{BB}G$ of the embodiment, when the column strobe signal $\overline{CAS}$ is made high level and the timing signal $\phi c1$ is made low level, the level detecting circuit LVM is rendered the operation state selectively. In the operation state, when the substrate back bias voltage $V_{BB}$ is decreased due to leak or the like and the absolute value is less than the composite threshold voltage of the MOSFETs Q11 and Q12, the output signal n2 of the level detecting circuit LVM is made high level selectively. In the level detecting process of the level detecting circuit LVM, the logic threshold level of the inverter circuit comprising the MOSFETs Q2 and Q13 is made low or high selectively in accordance with the output signal n2 of the level detecting circuit LVM. Consequently, the level detecting circuit LVM has the hysteresial level discrimination characteristics, and the operation is stabilized.

Other input terminal of the NAND gate circuit NAG1' is supplied with the inverted signal of the timing signal $\phi c1$ by the inverter circuit N2', i.e., the inverted timing signal $\overline{\phi c1}$. When the inverted timing signal $\overline{\phi c1}$ is made high level, in other words, when the timing signal $\phi c1$ is made low level and the level detecting circuit LVM is rendered the operation state selectively, the output signal n2 of the level detecting circuit LVM is made high level thereby the output signal n3' of the NAND gate NAG1' is made low level selectively. When the level detecting circuit LVM is rendered the operation state and the output signal n2' is made low level or when the level detecting circuit LVM is rendered the non-operation state, the output signal n3 of the NAND gate circuit NAG1' is made high level.

The output signal n3' of the NAND gate circuit NAG1', although not particularly limited thereto, is supplied to one input terminal of the NAND gate circuit NAG2'. Other input terminal of the NAND gate circuit NAG2' is supplied with the inverted signal of the timing signal $\phi r1$ by the inverter circuit N3', i.e., the inverted timing signal $\overline{\phi r1}$. Thereby the output signal n4 of the NAND gate circuit NAG2' is made high level selectively, when any of the output signal n3' of the NAND gate circuit NAG1' or the inverted timing signal $\overline{\phi r1}$ is made low level.

The output signal n4 of the NAND gate circuit NAG2', although not particularly limited thereto, is supplied to one input terminal of the NAND gate circuit NAG2.

The oscillation circuit control signal oc1, as shown in FIG. 8, is made high level selectively, (1) when the row address strobe signal $\overline{RAS}$ is made low level and the dynamic type RAM is rendered the selective state thereby the timing signal $\phi r1$ is made high level, and (2) when the column address strobe signal $\overline{CAS}$ is made high level theeby the level detecting circuit LVM of the substrate back bias voltage generator $V_{BB}G2$ is rendered the operation state and the absolute value of the substrate back bias voltage $V_{BB}$ is less than the prescribed value, i.e., the composite threshold voltage of the MOSFETs Q11 and Q12, on the condition that the inverted inner control signal $\overline{vbt}$ is high level.

In other words, the oscillation circuit control signal oc1 is fixed to the low level, (1) when the row address strobe signal $\overline{RAS}$ is made high level and the column address strobe signal $\overline{CAS}$ is made low level, (2) when both the row address strobe signal $\overline{RAS}$ and the column address strobe signal $\overline{CAS}$ are made high level and the absolute value of the substrate back bias voltage $V_{BB}$ is larger than the specified value, i.e., the composite threshold voltage of the MOSFETs Q11 and Q12, and (3) when the dynamic type RAM is rendered the substrate back bias voltage examination mode and the inverted inner control signal $\overline{vbt}$ is made low level.

One input terminal of the NAND gate circuit NAG6 is supplied with the output signal of the NAND gate circuit NAG5, and other input terminal thereof is supplied with the inverted inner control signal $\overline{vbt}$. One input terminal of the NAND gate circuit NAG5 is supplied with the inverted timing signal $\overline{r1}$, and other input terminal thereof is supplied with the timing signal $\phi c1$.

From these circumstances, the output signal of the inverter circuit N10, i.e., the oscillation circuit control signal oc2 is made high level selectively, when the output signal of the NAND gate circuit NAG6 is made high level, i.e., when any of the inverted timing signal $\overline{\phi r1}$ or the timing signal $\phi c1$ is made low level, in other words, as shown in FIG. 8, when the row address strobe signal $\overline{RAS}$ is made low level thereby the dynamic type RAM is rendered the selective state and the timing signal $\phi r1$ is made high level or when the column address strobe signal $\overline{CAS}$ is made high level and the timing signal $\phi c1$ is made low level, on the condition that the inverted inner control signal $\overline{vbt}$ is high level. As a result, the oscillation circuit OSC2 is rendered the operation state selectively in accordance with these conditions. Speaking this reversely, the operation of the oscillation circuit OSC2 is stopped selectively, when the row address strobe signal $\overline{RAS}$ is made high level and the column address strobe signal $\overline{CAS}$ is made low level.

As shown in FIG. 8, output signal of the NOR gate circuit NOG1, i.e., pulse signal $\phi 3$ is made high level selectively when both pulse signals $\phi 2$ and $\phi 2d$ are made low level. Also output signal of the inverter circuit N21, i.e., pulse signal $\phi 4$ is made high level selectively when both pulse signals $\phi 2$ and $\phi 2d$ are made high level. In other words, the pulse signals $\phi 3$ and $\phi 4$ are made complementary pulse signals so that both are not made high level simultaneously.

As above described, the oscillation circuit OSC2 is rendered the operation state selectively, when the oscillation circuit control signal oc2 is made high level, i.e., the dynamic type RAM is rendered the selective state or when the dynamic type RAM is rendered the non-selective state and the column address signal $\overline{CAS}$ is made high level. In this case, the voltage generator VG2 supplies relatively small operation current so that the variation amount due to the leak current to the substrate is corrected and the level detecting circuit LVM is rendered the operation state. On the other hand, when the row addressstrobe signal $\overline{RAS}$ is made high level and the column address strobe signal $\overline{CAS}$ is made low level, the operation of the oscillation circuit OSC2 is stopped selectively. Then since the operation of the voltage generator VG1 is also stopped as above described, the substrate back bias voltage generator $V_{BB}G2$ is rendered the completely stopped state.

The dynamic type RAM, as above described, is rendered the selective state when the row address strobe signal $\overline{RAS}$ is low level. In this case, the dynamic type RAM is rendered the $\overline{CAS}$ before $\overline{RAS}$ refresh mode when the column address strobe signal $\overline{CAS}$ is made low level prior to the variation of the row address strobe signal $\overline{RAS}$ to low level as shown in the memory cycles Cy. 1 and Cy. 2 of FIG. 8, and is rendered the ordinary operation mode when the column address strobe signal $\overline{CAS}$ is made low level in slightly delaying from the row address strobe signal $\overline{RAS}$ as shown in the cycle Cy. 3 of FIG. 8. On the other hand, while the row address strobe signal $\overline{RAS}$ is made high level and the dynamic type RAM is rendered the non-selective state, the column address strobe signal $\overline{CAS}$ is made high level or low level selectively in range to satisfy the starting condition. Since the row address strobe signal $\overline{RAS}$ is made high level and at the same time the column address strobe signal $\overline{CAS}$ is made low level, the operation of the substrate back bias voltage generator $V_{BB}G2$ is completely stopped as above described.

In the dynamic type RAM of the embodiment, although not particularly limited thereto, following user specification is specified. As shown in FIG. 8, when refresh operation by long cycle is performed, the period that the row address strobe signal $\overline{RAS}$ is made low level, in other words, the period that the substrate back bias voltage generator $V_{BB}G2$ is rendered the operation state unconditionally, is specified as $\overline{RAS}$ pulse width t ras and the time is made 1 μs for example. Also the period while the column address strobe signal $\overline{CAS}$ is made low level and then the row address strobe signal $\overline{RAS}$ is made low level, in other words, the period that the substrate back bias voltage $V_{BB}G2$ is rendered the completely stopped state, is specified as $\overline{CAS}.\overline{RAS}$ delay time t crd, and the time is made 300 μs for example. Further, the period that the refresh mode is executed, is specified as refresh period t rc, and the time is made 400 μs for example. Of course, such user specification is determined in accordance with the examination result of the dynamic type RAM, i.e., the recovery time or the holding time of the substrate back bias voltage $V_{BB}$, and guarantees the time that the level of the substrate back bias voltage $V_{BB}$ once decreased due to the operation state of thd substrate back bias voltage generator $V_{BB}G2$ is rendered sufficiently or the time that the substrate back bias voltage generator $V_{BB}G2$ is rendered the completely stopped state and still the substrate back bias voltage $V_{BB}$ can hold the required level. From these circumstances, the column address strobe signal $\overline{CAS}$ is made low level selectively in accordance with the user specification and the substrate back bias voltage generator $V_{BB}G2$ is rendered the completely stopped state, thereby the average operation current of the substrate back bias voltage generator $V_{BB}G2$ can be reduced without obstructing the operation of the dynamic type RAM. As a result, the consumtion power of the dynamic type RAM in the refresh mode can be reduced and the dynamic type RAM of super low consumption power to be used for battery backup can be realized.

What is claimed is:

1. A semiconductor memory device having a normal operation mode and refresh mode comprising:
    a first external terminal for receiving a row address strobe signal ($\overline{RAS}$);
    a second external terminal for receiving a column address strobe signal ($\overline{CAS}$);
    a first control means coupled to said first and second external terminals for initiating said refresh mode in response to said column address strobe signal being at a logic "low" level when said row address strobe signal is at a transitional logic level corresponding to a falling edge;
    a first back-bias voltage generation means coupled to a substrate of said semiconductor memory device for biasing said substrate with a first current supply capacity;
    a second back-bias voltage generation means coupled to said substrate for biasing said substrate with a second current supply capacity;
    a second control means coupled to said first control means and to said first and second back-bias voltage generation means for placing said first back-bias voltage generation means in an operation state in response to the first control means initiating said refresh mode during a predetermined time, and for placing said second back-bias voltage generation means in a non-operation state during said refresh mode.

2. A semiconductor memory device according to claim 1, further comprising a detection means for detecting a voltage level of said substrate, wherein said first back-bias voltage generation means is controlled on the basis of an output of said detection means.

3. A semiconductor memory device according to claim 2, further comprising a third control means for placing said detection means in a non-operation state during said refresh mode.

4. A semiconductor memory device according to claim 3, wherein said first current supply capacity is greater than said second current supply capacity.

5. A semiconductor memory device according to claim 4, wherein said first control means includes means for clearing said refresh mode in response to said row address strobe signal returning to a logic "high" level.

6. A semiconductor memory device according to claim 5, wherein said second control means includes means to place said first back-bias voltage generation means in an operation state in response to said row address strobe signal returning to a logic "high" level.

7. A semiconductor memory device according to claim 5, wherein a period of said operation state of said first back-bias voltage generation state is shorter than a period of said refresh mode.

* * * * *